(12) United States Patent
Hsiao et al.

(10) Patent No.: US 7,356,747 B2
(45) Date of Patent: Apr. 8, 2008

(54) DECISION SELECTION AND ASSOCIATED LEARNING FOR COMPUTING ALL SOLUTIONS IN AUTOMATIC TEST PATTERN GENERATION (ATPG) AND SATISFIABILITY

(75) Inventors: Michael S. Hsiao, Blacksburg, VA (US); Kameshwar Chandrasekar, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 211 days.

(21) Appl. No.: 11/194,543

(22) Filed: Aug. 2, 2005

(65) Prior Publication Data
US 2006/0031730 A1 Feb. 9, 2006

Related U.S. Application Data

(60) Provisional application No. 60/598,444, filed on Aug. 4, 2004.

(51) Int. Cl.
*G01R 31/28* (2006.01)
(52) U.S. Cl. ..................................... 714/738
(58) Field of Classification Search ............... 714/738, 714/728, 739
See application file for complete search history.

(56) References Cited

U.S. PATENT DOCUMENTS 6,886,124 B2* 4/2005 Wang ......................... 714/738

7,185,254 B2* 2/2007 Ishida et al. ................ 714/738

OTHER PUBLICATIONS

Panda et al. "Who are the Variables in Your Neighborhood" Dept. of Electrical and Computer Engineering, Univ. of Colorado at Boulder; pp. 74-79 , 1995.
Richard Rudell, "Dynamic Variable Ordering for Ordered Binary Decision Diagrams" pp. 42-47, 1993.
Iyer et al. "Satori—A Fast Sequential Sat Engine for Circuits" Dept of ECE, University of Cal. pp. 320-325; 2003.
Marques-Silva et al. "GRASP: A Search Algorithm for Propositional Satisfiability" IEEE Transactions on Computers, vol. 48 No. 5, pp. 506-521; May 1999.
Zhang et al. "Efficient Conflict Driven Learning In a Boolean Satisfiability Solver" pp. 279-285; 2001.
Chang et al. "Short Papers" IEEE Transactions on Computer-aided Design on Integrated Circuits and Systems, vol. 19, No. 1 pp. 152-160; Jan. 2000.
Lawrence H. Goldstein "Controllability/Observability Analysis Digital Circuits" vol. CAS 26, No. 9; Sep. pp. 685-693; Sep. 1979.

(Continued)

*Primary Examiner*—James C. Kerveros
(74) *Attorney, Agent, or Firm*—Whitham Curtis Christofferson & Cook, P.C.

(57) ABSTRACT

An all solutions automatic test pattern generation (ATPG) engine method uses a decision selection heuristic that makes use of the "connectivity of gates" in the circuit in order to obtain a compact solution-set. The "symmetry in search-states" is analyzed using a "Success-Driven Learning" technique which is extended to prune conflict sub-spaces. A metric is used to determine the use of learnt information a priori, which information is stored and used efficiently during "success driven learning".

4 Claims, 9 Drawing Sheets

OTHER PUBLICATIONS

Wang et al. "A Signal Correlation Guided ATPG Solver And Its Applications For Solving Difficult Industrial Cases" pp. 436-441; Jun. 2003.

Iyer et al. "On the A Development of an ATPG based Satisfiability Checker" University of California; 2002.

Kang et al. "SAT-Based Unbounded Symbolic Model Checking" pp. 840-843; Jun. 2003.

Ken L. McMillan "Applying SAT Methods in Unbounded Symbolic Model Checking" pp. 250-264; 2001.

Li et al. "A Novel All-Solutions Solver for Efficient Preimage Computation" Computer Science; 2004.

Sheng et al. "Efficient Preimage Computation Using A Novel Success-Driven ATPG" Computer Science; 2003.

Bern et al. "Short Papers" IEEE Transactions on Computer-Aided Design of Integrated Circuits and Systems, vol. 15, No. 1 pp. 127-130; Jan. 1996.

Gergov et al. "Efficient Boolean Manipulation With OBDD's can be Extended to FBDD's" IEEE Transactions on Computers, vol. 43, No. 10, pp. 1197-1209; Oct. 1994.

Aloul et al. "MINCE: A Static Global Variable-Ordering for SAT and BDD" 2001.

Chung et al. "Efficient Variable Ordering Heuristics for Shared ROBDD" pp. 1690-1693.

Giraldi et al. "EST: The New Frontier in Automatic Test-Pattern Generation" 27th ACM/IEEE Design Automation Conference; 1990.

Wang et al. "Conflict Driven Techniques for Improving Deterministic Tet Pattern Generation" pp. 87-93; 2002.

Chandrasekar et al. "ATPG-Based Preimage Computation: Efficient Search Space Pruning with ZBDD" pp. 117-122; 2003.

Pomeranz et al. "An Efficient Nonenumerative Method to Estimate the Path Delay Fault Coverage in Combinational Circuits" IEEE Transactions on Computer-Aided Design of Intergrated Circuits and Systems, vol. 13, No. 2, pp. 240-250; Feb. 1994.

\* cited by examiner

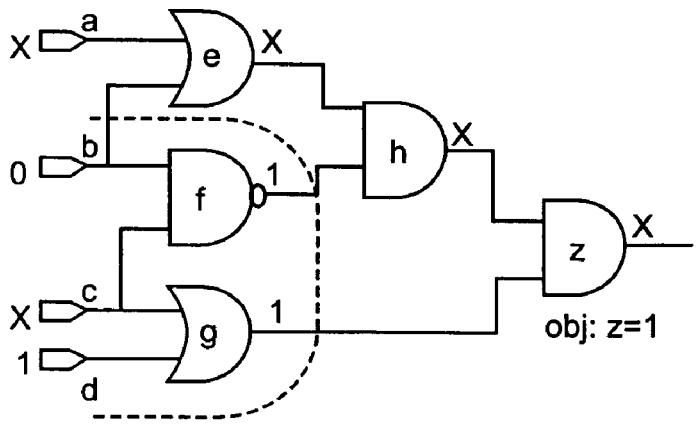
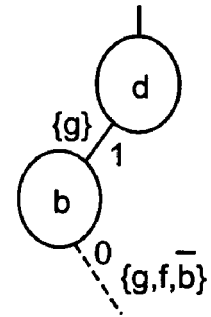

Figure 1A                    Figure 1B

```
// # paths through a gate = # paths in its fanin_cone *
                          // # paths in its fanout_cone
// # paths in fanin/fanout cone of each gate is counted once
function guidance_measures(levelized_ckt) {
    Initialize the dyn_msr of all gates to 0
    // step1. Initialize the dyn_msr of gates in the cutset
    for (each gate in the cut_set)
        dyn_msr[gate] = stat_msr[gate];

// step 2. Update the dyn_msr for all gates in
    // the fanout_cone of the cutset
    for (each gate in fanout_cone of cut_set)
        dyn_msr[gate] = Sum(dyn_msr[fanins]) *
                             #paths[fanout_cone]
}
```

Figure 2

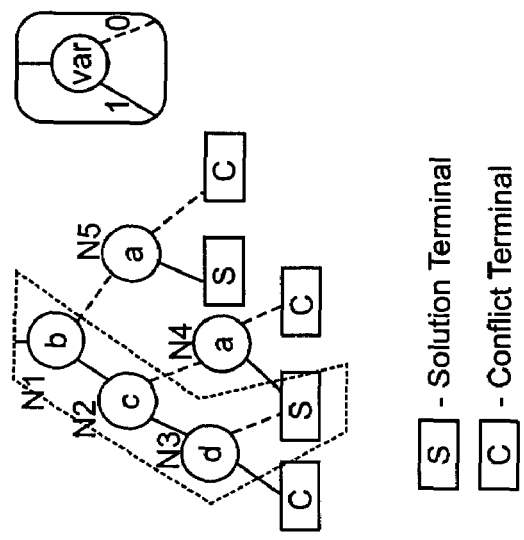
*Figure 4C*
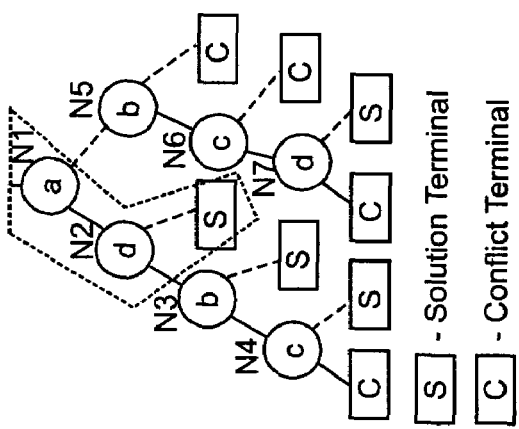
*Figure 4B*
| Gate | a | b | c | d | e | f | g | h |
|------|---|---|---|---|---|---|---|---|
| SCOAP (C1, C0) | 1,1 | 1,1 | 1,1 | 1,1 | 3,2 | 2,4 | 2,5 | 5,5 |
| Ours (m) | 1 | 2 | 2 | 1 | 4 | 3 | 3 | 6 |
*Figure 4D*
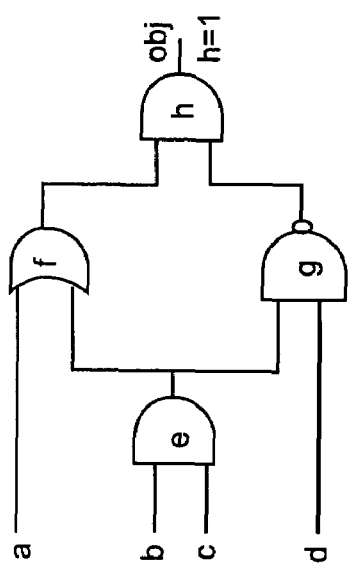
*Figure 4A*

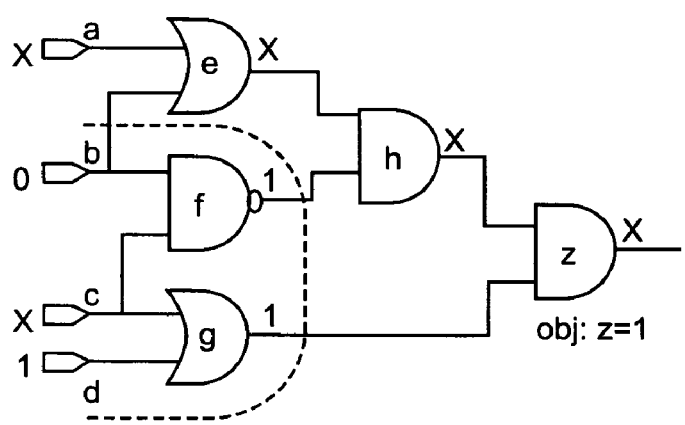
Figure 6A                    Figure 6B

| Circuit | Heuristic | #solns | #bktrks | #nodes | T (s) |
|---|---|---|---|---|---|
| s3384 - 1 | Dist | 464M | Abort | | |
| | COP | 19M | Abort | | |
| | SCOAP | 1.8G | 2.6K | 2K | 0.69 |
| | Stat-Conn | 1.9G | 1K | 396 | 0.43 |
| | Dyn-Conn | 1.7G | 518 | 398 | 0.62 |
| s3384 - 2 | Dist | 0 | Abort | | |
| | COP | 0 | Abort | | |
| | SCOAP | 0 | Abort | | |
| | Stat-Conn | 0 | Abort | | |
| | Dyn-Conn | 108M | 158K | 2.5K | 78.58 |
| s3384 - 3 | Dist | 0 | Abort | | |
| | COP | 0 | Abort | | |
| | SCOAP | .1G | 69K | 57K | 10.64 |
| | Stat-Conn | 1.1G | 16K | 7K | 2.19 |
| | Dyn-Conn | 1.8G | 9K | 1.4K | 4.7 |
| s13207 - 1 | Dist | 798K | 349 | 342 | 0.44 |
| | COP | 241K | 255 | 250 | 0.42 |
| | SCOAP | 467K | 338 | 339 | 0.44 |
| | Stat-Conn | 974K | 782 | 784 | 0.51 |
| | Dyn-Conn | 952K | 195 | 193 | 0.64 |
| s13207 - 2 | Dist | 1.5G | Abort | | |
| | COP | 2.5G | Abort | | |
| | SCOAP | 1.4G | 40K | 7K | 9.24 |
| | Stat-Conn | 2.5G | Abort | | |
| | Dyn-Conn | 889M | 3.8K | 2.7K | 5.22 |
| s13207 - 3 | Dist | 0 | 1526 | 0 | 1.32 |
| | COP | 0 | 2220 | 0 | 1.45 |
| | SCOAP | 0 | 1836 | 0 | 1.41 |
| | Stat-Conn | 0 | 100 | 0 | 0.41 |
| | Dyn-Conn | 0 | 215 | 0 | 1.06 |
| s9234 - 1 | Dist | 537M | Abort | | |
| | COP | 41M | 43K | 31K | 5.19 |
| | SCOAP | 367M | 34K | 28K | 4.32 |
| | Stat-Conn | 3.9G | Abort | | |
| | Dyn-Conn | 1.6G | 8K | 6.5K | 7.81 |
| s9234 - 2 | Dist | 0 | 1.9K | 0 | 0.56 |
| | COP | 0 | 409 | 0 | 0.36 |
| | SCOAP | 0 | 1.6K | 0 | 0.53 |
| | Stat-Conn | 0 | 15 | 0 | 0.32 |
| | Dyn-Conn | 0 | 19 | 0 | 0.34 |
| s9234 - 3 | Dist | 0 | 42K | 0 | 5.8 |
| | COP | 0 | Abort | | |
| | SCOAP | 0 | Abort | | |
| | Stat-Conn | 0 | 24K | 0 | 3.02 |
| | Dyn-Conn | 0 | 7K | 0 | 6.28 |

Note a) #solns: number of solution cubes
Note b) Different guidance heuristics lead to different solution cubes

Figure 7-1

| Circuit | Heuristic | #solns | #bktrks | #nodes | T (s) |
|---|---|---|---|---|---|
| s5378 - 1 | Dist | 0 | 361 | 0 | 0.28 |
| | COP | 0 | 59 | 0 | 0.26 |
| | SCOAP | 0 | 93 | 0 | 0.26 |
| | Stat-Conn | 0 | 8 | 0 | 0.25 |
| | Dyn-Conn | 0 | 3 | 0 | 0.26 |
| s5378 - 2 | Dist | 2M | 3K | 1.3K | 0.71 |
| | COP | 82K | 1.1K | 525 | 0.5 |
| | SCOAP | 218K | 1.9K | 779 | 0.58 |
| | Stat-Conn | 6.3M | 887 | 392 | 0.49 |
| | Dyn-Conn | 299K | 389 | 178 | 0.66 |
| s5378 - 3 | Dist | 43K | 302 | 303 | 0.42 |
| | COP | 26K | 521 | 505 | 0.44 |
| | SCOAP | 32K | 467 | 440 | 0.43 |
| | Stat-Conn | 13K | 286 | 278 | 0.41 |
| | Dyn-Conn | 19K | 178 | 167 | 0.52 |
| s15850 - 1 | Dist | 308M | Abort | | |
| | COP | 2.4G | Abort | | |
| | SCOAP | 605M | 38K | 27K | 7.25 |
| | Stat-Conn | 3.8G | Abort | | |
| | Dyn-Conn | 1.2G | 313K | 26K | 59.92 |
| s15850 - 2 | Dist | 3.5G | Abort | | |
| | COP | 3.3G | Abort | | |
| | SCOAP | 1.6G | Abort | | |
| | Stat-Conn | 3.6G | Abort | | |
| | Dyn-Conn | 1.7G | 177K | 101K | 269.99 |
| s15850 - 3 | Dist | 0 | Abort | 0 | 69.83 |
| | COP | 0 | 2 | 0 | 0.68 |
| | SCOAP | 0 | 2 | 0 | 0.68 |
| | Stat-Conn | 0 | 1 | 0 | 0.71 |
| | Dyn-Conn | 0 | 1 | 0 | 0.71 |
| s38584 - 1 | Dist | 104M | 20K | 20K | 13 |
| | COP | 1G | Abort | | |
| | SCOAP | 1.1G | Abort | | |
| | Stat-Conn | 1.3G | 51K | 28K | 29.71 |
| | Dyn-Conn | 1.4G | 21K | 8.5K | 27.57 |
| s38584 - 2 | Dist | 1.4G | 4.5K | 4K | 1.8 |
| | COP | 1G | Abort | | |
| | SCOAP | 1.5G | 3.8K | 3.2K | 1.81 |
| | Stat-Conn | 1.2G | 3.2K | 3.1K | 1.67 |
| | Dyn-Conn | 1.5G | 1.7K | 1.7K | 7.79 |
| s38584 - 3 | Dist | 3.5G | Abort | | |
| | COP | 1.3G | Abort | | |
| | SCOAP | 3.7G | Abort | | |
| | Stat-Conn | 1.2G | Abort | | |
| | Dyn-Conn | 1.9G | 46K | 45K | 203.05 |

Note a) #solns: number of solution cubes
Note b) Different guidance heuristics lead to different solution cubes

*Figure 7-2*

| Circuit | Heuristic | #solns | #bktrks | #nodes | T (s) | Circuit | Heuristic | #solns | #bktrks | #nodes | T (s) |
|---|---|---|---|---|---|---|---|---|---|---|---|
| b04 | Dist | 20K | 3K | 1.2K | 0.49 | b10 | Dist | 118 | 107 | 85 | 0.24 |
| | COP | 32K | 3.5K | 2.2K | 0.5 | | COP | 33 | 60 | 45 | 0.23 |
| | SCOAP | 5M | Abort | | | | SCOAP | 36 | 59 | 50 | 0.24 |
| | Stat-Conn | 26K | 1.5K | 617 | 0.34 | | Stat-Conn | 22 | 39 | 33 | 0.23 |
| | Dyn-Conn | 27K | 2K | 906 | 0.71 | | Dyn-Conn | 31 | 46 | 37 | 0.23 |
| b12 - 1 | Dist | 936K | 23K | 10K | 1.99 | b13 - 1 | Dist | 594 | 46 | 44 | 0.24 |
| | COP | 8.5K | 1.8K | 1.5K | 0.36 | | COP | 432 | 175 | 149 | 0.24 |
| | SCOAP | 445K | 38K | 7.5K | 3.3 | | SCOAP | 2K | 225 | 207 | 0.24 |
| | Stat-Conn | 128K | 978 | 793 | 0.31 | | Stat-Conn | 1.2K | 113 | 93 | 0.24 |
| | Dyn-Conn | 478K | 504 | 295 | 0.39 | | Dyn-Conn | 612 | 70 | 45 | 0.25 |
| b12 - 2 | Dist | 261K | Abort | | | b13 - 2 | Dist | 36K | 2K | 1K | 0.32 |
| | COP | 1.7K | 6K | 5K | 0.65 | | COP | 540 | 241 | 187 | 0.25 |
| | SCOAP | 1M | 66K | 9.6K | 6 | | SCOAP | 9.5K | 2.6K | 1.6K | 0.35 |
| | Stat-Conn | 51K | 1.7K | 740 | 0.38 | | Stat-Conn | 3.5K | 128 | 103 | 0.23 |
| | Dyn-Conn | 114K | 764 | 338 | 0.44 | | Dyn-Conn | 2K | 124 | 121 | 0.25 |
| b12 - 3 | Dist | 38K | 3.3K | 2.3K | 0.52 | b13 - 3 | Dist | 112 | 177 | 106 | 0.34 |
| | COP | 8.8K | 1.3K | 1K | 0.36 | | COP | 21 | 91 | 78 | 0.25 |
| | SCOAP | 16K | 915 | 734 | 0.32 | | SCOAP | 72 | 133 | 96 | 0.24 |
| | Stat-Conn | 30K | 1.3K | 795 | 0.35 | | Stat-Conn | 60 | 118 | 55 | 0.25 |
| | Dyn-Conn | 131K | 717 | 486 | 0.43 | | Dyn-Conn | 21 | 63 | 42 | 0.25 |

Note a) #solns: number of solution cubes
Note b) Different guidance heuristics lead to different solution cubes

*Figure 8*

| ckt | Without Cut-set Metric | | | | With Cut-set Metric | | | | |
|---|---|---|---|---|---|---|---|---|---|
| | #solns | #nodes | #cut-sets | #times-used | time(s) | #solns | #nodes | #cut-sets | #times-used | time(s) |
| s349 | 200 | 193 | 366 | 207 | 0.26 | 200 | 193 | 101 | 125 | 0.27 |
| s444 | 24 | 65 | 81 | 19 | 0.25 | 24 | 65 | 54 | 18 | 0.24 |
| s526 | 54 | 84 | 94 | 41 | 0.25 | 54 | 84 | 43 | 35 | 0.24 |
| s4863 | 0 | 0 | 132K | 8K | 70.71 | 0 | 0 | 125K | 8K | 71.46 |
| s1488 | 57 | 95 | 172 | 59 | 0.26 | 57 | 95 | 3 | 38 | 0.28 |
| s1494 | 9 | 29 | 95 | 36 | 0.26 | 9 | 29 | 7 | 45 | 0.28 |
| s1269 | 183K | 113K | 236K | 120K | 39.89 | 183K | 113K | 148K | 204K | 57.61 |
| s1423 | All | cut-sets | exhausted | | | 330K | 2.5K | 150K | 50K | 64.73 |
| s1423.1 | 912 | 810 | 123K | 954 | 23.66 | 912 | 810 | 110K | 825 | 23.10 |
| s5378 | 805M | 272 | 462 | 211 | 0.56 | 805M | 272 | 444 | 211 | 0.56 |
| s9234 | All | cut-sets | exhausted | | | 0 | 0 | 200K | 190K | 491.71 |
| s9234.1 | 0 | 0 | 84K | 56K | 133.19 | 0 | 0 | 77K | 59K | 151.24 |
| s15850.1 | 981M | 3K | 4.8K | 2.7K | 14.1 | 981M | 3K | 2.2K | 8K | 38.97 |
| s15850 | 0 | 0 | 12K | 10K | 41.44 | 0 | 0 | 10K | 11K | 48.66 |
| b04 | 6.5K | 6.8K | 102K | 2.6K | 254.2 | 6.5K | 6.8K | 20K | 2.3K | 282.49 |
| b11 | 559 | 1.5K | 15K | 1.3K | 35.72 | 559 | 1.5K | 189 | 705 | 36.32 |
| b12 | 65K | 1.2K | 1.2K | 576 | 6.18 | 65K | 1.2K | 1K | 576 | 6.18 |

Note a) #solns: number of solution cubes
Note b) Dyn-Con is used. Hence, the same #soln cubes are obtained for both techniques

*Figure 9*

DECISION SELECTION AND ASSOCIATED LEARNING FOR COMPUTING ALL SOLUTIONS IN AUTOMATIC TEST PATTERN GENERATION (ATPG) AND SATISFIABILITY

CROSS REFERENCE TO RELATED APPLICATION

This application claims the benefit of the filing date of provisional application Ser. No. 60/598,444 filed on Aug. 4, 2004, filed by Michael S. Hsiao and Kameshwar Chandrasekar for "Decision Selection and Associated Learning for Computing all Solutions in Automatic Test Pattern Generation (ATPG) and Satisfiability".

GOVERNMENT LICENSE RIGHTS

The U.S. Government has a paid-up license in this invention and the right in limited circumstances to require the patent owner to license others on reasonable terms as provided by the terms of National Science Foundation Grants CCR-0196470 and CCR-0305881.

DESCRIPTION

BACKGROUND OF THE INVENTION

1. Field of the Invention

The present invention generally relates to an automatic test pattern generation (ATPG) engine and, more particularly, to a method that quickly analyzes and efficiently models a new decision selection mechanism based on connectivity gates in a circuit for the purpose of computing all solutions for a target objective. Symmetry in search states is analyzed for success driven learning to reduce the number of backtraces incurred during the solution search. A new metric is implemented for determining the use of learned information for storage and later use. The invention has application in semiconductor design and manufacture as well as other design verification environments.

2. Background Description

In recent years, Automatic Test Pattern Generation (ATPG)/Boolean Satisfiability (SAT) based methods have offered a potential substitute for Reduced Ordered Binary Decision Diagrams (ROBDD) based methods. Unlike ROBDD based methods that can suffer from memory explosion, ATPG/SAT based methods can perform image or preimage computation with reduced memory requirements. Image/Preimage computation is performed by modifying the underlying ATPG algorithm, to generate all the available solutions, and it is a key step in sequential equivalence checking and unbounded model checking. In addition to design verification, ATPG engines that are able to generate multiple solutions can also be used to generate different and distinct multiple-detect test vectors for a given fault, thus improving the overall defect coverage of a test suite.

Traditionally, ATPG engines are guided by the testability measures of the circuit. Several heuristics have been developed to determine these measures that help to find any available solution quickly. The distance based testability measures account for the difficulty of testing a gate, based on its distance from the primary inputs and primary outputs. The 0/1 probability at the output of each gate in the circuit have been computed and used as testability measures. Certain numbers, called SCOAP measures, have been derived for each gate in the circuit, that represent the difficulty of justifying and propagating a value. All these testability measures guide the ATPG engine while backtracing from the objective to select a decision variable. Improvements to obtain better testability measures have been incorporated using the concept of super-gates. However, the worst-case complexity of obtaining these measures can he exponential. Recently, a better approximation for the testability measures has been obtained using implications generated in the circuit. Based on implication reasoning, a correlation factor that accounts for signal correlations in the circuit is estimated. However, all these testability measures aim at finding a single solution quickly. Likewise, in SAT, many variable/decision selection strategies have been proposed. such as MOMS (Maximum Occurences in clause of Minimum Size), DLIS (Dynamic Largest Individual Sum) and VSIDS (Variable State Independent Decaying Sum). However, these methods lack the structural information available to ATPG engines. SAT and ATPG have been integrated to develop an ATPG based SAT solver. The variable selection strategy of ATPG is used due to their superiority in choosing variables related to the objective.

"All-solutions ATPG" based methods have found applications in Model checking sequential circuits, and they can also improve the defect coverage of a test suite, by generating distinct multiple-detect patterns. Conventional decision selection heuristics and learning techniques for an ATPG engine were originally developed to quickly find any available (single) solution. Such decision solution heuristics may not be the best for an "all-solutions ATPG" engine, where all the solutions need to be found. In this paper, we explore new techniques to guide an "all-solutions ATPG engine." An all-solutions ATPG attempts to build a complete decision tree (which can be reduced to a graph by sharing common sub-trees) that is essentially a Free Binary Decision Diagram (Free BDD). Conventionally, the testability measures of the circuit guide an ATPG engine to select decisions as they search for the solution. As a result, the variable order in the Free BDD conforms to the testability measures of the circuit. It is necessary to bias the variable order in such a way that we obtain a compact Free BDD as a whole. A compact Free BDD helps to reduce the size of the decision tree and in turn speeds up the ATPG engine. If the number of solutions in very large, in the order of billions, then it is not possible to store each solution oneby-one due to memory and time limitation. This phenomenon is referred to as solution explosion and it has been shown that the final solution-set can be efficiently represented by the decision tree as a Free BDD. Therefore it is necessary to obtain a compact Free BDD in order to address the solution explosion problem as well. Furthermore, as each ATPG decision leads to a different search-state in the decision tree, the number of search-states can be exponential in the number of inputs. Since each search-state is stored in a hash table, for use in success-driven learning, the memory required to store all of the search-states becomes a critical issue. Storing all the search-states in a knowledge-base may potentially lead to memory explosion for large circuits. In order to reduce the size of the knowledge-base and still benefit from useful search-states, it may be sufficient to store only the frequently occurring search-states.

Related work on BDD variable ordering and learning heuristics includes OBDD based methods that are very sensitive to their variable order and thus are limited to small and medium sized circuits. Significant amount of work has been done on finding an efficient variable ordering technique. Most of the work aims at placing related variables together in order to obtain a compact BDD. A PODEM based variable ordering technique has been considered for building ROBDDs. The testability measures of PODEM are used to back trace to the primary inputs by a depth-first search and the inputs connected by shorter paths are placed together. Recently, static variable ordering techniques have been proposed, and experimental results showed that these techniques can be better than dynamic variable ordering techniques. It is supposed that placing connected variables together and partitioning the variables lead to compact BDDs and faster SAT. On the other hand, Free BDDs (FBDDs) are relaxed versions of Ordered BDDs, in which variables can appear in different orders along different paths but each variable occurs only once along any given path. They are more compact than Ordered BDDs and sometimes lead to exponential savings in memory. Although significant amount of work has been done to develop good-variable ordering heuristics for ROBDDs, not much work has been done for Free BDDs.

In addition to variable selection heuristics, learning plays an important role in SAT/ATPG based methods. It helps to overcome the inherent time limitation of these methods and compete with BDD based methods. Powerful learning techniques have been introduced for ATPG. Efficient conflict-driven learning techniques have also been introduced for SAT based methods. Learning techniques have been proposed for an all-solutions SAT solver. These learning techniques improve the efficiency of the SAT solver that is an integral part of unbounded model checking. The strengths of both SAT & ATPG have been combined to provide efficient learning techniques for the sequential justification problem. It has also been proposed to provide signal correlation guided learning for an ATPG based SAT solver and obtained a speedup for hard industrial circuits. In all these aforementioned ATPG/SAT engines, the knowledge is in the form of implications, assertions or conflict clauses. Efficient manipulation of knowledge is required to reduce the overhead in storing and using the knowledge base.

Recently, a new type of "success-driven learning" that efficiently prunes the search-space for "ATPG based preimage computation" by identifying identical solution-sub-spaces has been introduced. The Transition Relation is represented by a levelized circuit and the set of states is stored in a Free BDD. A PODEM based ATPG engine is invoked to find all the solutions, resulting in a preimage where all the current state variables are quantified. Equivalent search-states that lead to the same solution subspace are identified to prune the search-space. The decision tree obtained during solution-search, is stored as a Free BDD that represents the complete preimage set. As solution subspaces heavily overlap during preimage computation, considerable savings is obtained in terms of time and memory. "Augmented success driven learning" and "search-state based conflict driven learning" have been introduced to further prune the search space for ATPG based preimage computation. However, conventional testability measures were used to guide the ATPG engine, resulting in suboptimal all-solutions FBDDs.

SUMMARY OF THE INVENTION

It is therefore an object of the present invention to provide a new decision selection heuristic that makes use of the "connectivity of gates" in the circuit in order to obtain a compact solution-set.

It is another object of the invention to provide a way to analyze the "symmetry in search-states" that was exploited in "Success-Driven Learning" and extend it to prune conflict sub-spaces as well.

It is a further object of the invention to provide a new metric that determines the use of learnt information a priori, which information is stored and used efficiently during "success driven learning".

According to the invention, there is provided a new decision selection heuristic that guides an "all-solutions ATPG engine" to obtain an efficient variable order for the Free BDD. The invention implements the concept of symmetry in search states for ATPG which is based on analysis of a theoretical formulation for success driven learning. In order to reduce the number of search-states stored during success driven learning, the invention provides a new metric that determines the use of a search-state.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a logic diagram illustrating an example of a search state representative and its decision tree;

FIG. 2 is an algorithm showing the dynamic connectivity measures for the circuit shown in the logic diagram of FIG. 1;

FIG. 4 is a logic diagram and contrasting decision trees used to illustrate the effect of different testability measures;

FIG. 6 is a logic diagram, similar to FIG. 1, and table of symmetric input assignments;

FIG. 7 is a table of an all solutions ATPG for ISCAS '89 circuits;

FIG. 8 is a table of an all solutions ATPG for ITC '99 circuits; and

FIG. 9 is a table illustrating the efficiency of the cut-set metric according to the present invention.

DETAILED DESCRIPTION OF A PREFERRED EMBODIMENT OF THE INVENTION

Figure 3:
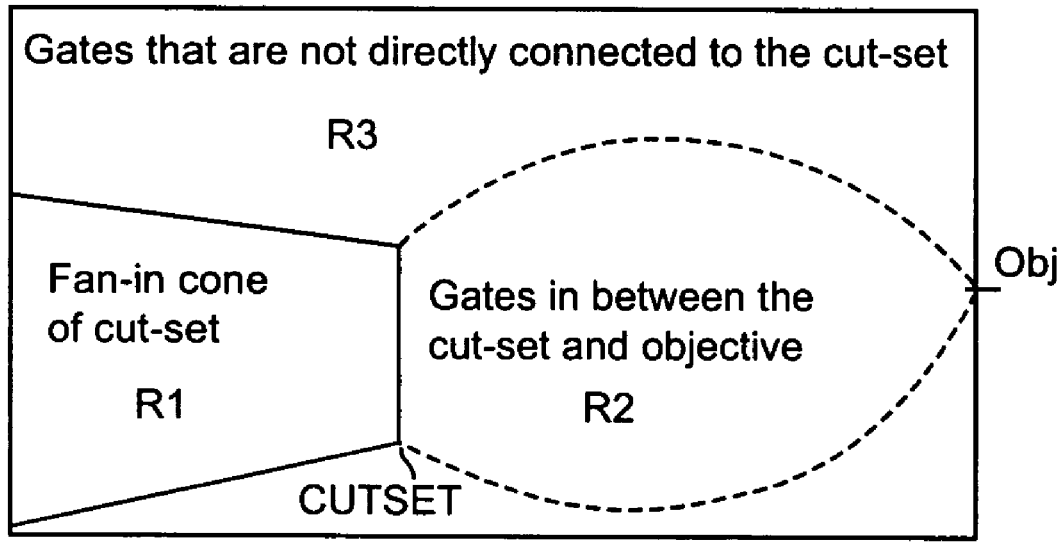
FIG. 3 is an illustration showing the dynamic and static connectivity for the circuit shown in the logic diagram of FIG. 1.

Because an ATPG engine implicitly explores the entire search-space to generate a solution, "an all-solutions ATPG engine" must continue and search for the next solution after each solution is found, until all solutions have been found. Each decision is considered a node in the decision tree and the entire search-space is explored to find all solutions. A few terms are introduced before explaining the concept of success-driven learning.

Decision Tree: The tree obtained by the branch-and-bound procedure of ATPG, with input assignments as internal decision nodes, is called the decision tree.

Search-State: After choosing each decision and performing logic simulation, logic values of all the internal gates form a state in the circuit. This internal state of the circuit after each decision is considered a search-state for the decision tree.

Cut-set: Consider the circuit as a directed acyclic graph, C, with edges directed from primary inputs to primary outputs. If we remove the fanout-stems of a set of gates from C to partition the graph into two sub-graphs X and Y, such that all the edges (that exist in C) across X and Y are directed from primary inputs to primary outputs, then the set of gates is called a cut-set.

Cut-set for search-state: Each search-state can be uniquely represented by a cut-set in the circuit. After each decision, the cut-set can be obtained by a multiple backtrace from the ATPG objective. The first frontier of specified nodes, encountered during backtrace, is the cut-set for search-stare. In the sequel, we use the term cut-set to refer to "cut-set for search-state". Cut-sets that lead to solution subspaces and their decision tree nodes are stored in a hash-table. For the circuit in FIG. 1, a partial decision tree is shown. The sets indicated on the decision edges (e.g., {g} and {g, f, b}) are cut-sets for the corresponding search-states. For the last decision (b=0), cut-set {g, f, $\overline{b}$} is denoted by the dashed line, in FIG. 1.

solution/conflict branch: A branch in the decision tree that has at least-one/no solution below it.

solution/conflict cut-set: A cut-set for the search-state in the solution/conflict branch.

solution/conflict subspace: A search subspace below a solution/conflict branch.

The cut-sets that lead to solution sub-spaces can be stored in a hash-table. A particular solution cut-set in the circuit will lead to a specific solution subspace in the decision tree. If the same cut-set is encountered again, then we can simply link to that portion of the decision tree, instead of re-searching the same search space. After each decision, we search for the current cut-set in the hash-table. If an equivalent cut-set exists, we simply link the current branch to the stored node of the decision tree. Otherwise, we proceed with the usual search process. In this way, previously encountered search subspaces are not repeatedly explored using this technique.

With the help of existing testability measures, conventional ATPG engines backtrace only through the easy (highly testable) portions of the circuit and stop as soon as one solution is found. Usually, this solution can be considered as the easiest solution with respect to the ATPG search process. However, an "all-solutions ATPG engine" needs to explore the entire circuit to find all the available solutions. So the guidance heuristic for an all-solutions ATPG engine need not necessarily depend on the measures that only focus on the easier portions of the circuit.

We view the problem of finding all solutions that satisfy an objective as the process of constructing the decision tree as quickly as possible. This in turn is the problem of finding an efficient variable ordering technique for a Free BDD. The variable ordering heuristic is integrated into the back-trace routine of the ATPG engine. Unlike the dynamic variable ordering techniques in BDDs, we do not try to move the variable up or down to find a suitable position tor a variable. Instead, after choosing each variable, we dynamically choose the next variable that is suitable for that position.

A hypergraph is built from the CNF formula and a static variable order is obtained by partitioning the variables and placing connected variables together, in order to obtain a good variable order. It is conjectured that well connected variables should he placed together for SAT and BDD. In our technique, we exploit the inherent graph structure of the circuit to dynamically find the gates that are well connected (by combinational paths) to the previously made decisions (represented by search-state in the circuit). After each decision, we estimate the connectivity of each gate to the previous decisions. While backtracing, we always choose the gate that has the highest connectivity measure. In some cases, we only consider the connectivity of a gate to the objective. In this way, we attempt to put all connected variables together in the decision tree. Gates that are well connected are likely to be highly correlated and hence should be chosen together. In a PODEM based ATPG, we decide on the primary inputs that are obtained by the back-trace routine. The following subsections further explain the concept of connected variables.

At each decision during ATPG, the connectivity of a gate is estimated as the number of combinational paths that connect the gate to the cut-set (formed by previous decisions) and the objective. From Graph Theory, a well-known linear time algorithm is sufficient to compute the number of paths passing through each gate in the circuit. A similar algorithm has been used to estimate the fault coverage of path delay faults. Due to its linear time complexity, the computation overhead in estimating the connectivity measures is usually very small and it can easily be integrated into the backtrace routine of the ATPG engine.

Initially, the number of paths that connect a gate to the objective and the primary inputs is estimated. This measure is estimated for all gates in the circuit and stored as a static connectivity measure. After each decision, a dynamic connectivity measure is assigned for all gates in the fanout cone of the cut-set. A basic algorithm is shown in FIG. 2. The gates in the cut-set are initialized to their static measures. These gates represent the previously made decisions in the decision tree. The gates outside the cut-set fanin/fanout cone (R3 in FIG. 3) are not directly connected to the decisions made so far. So they are initialized to 0. Next, for each gate in the fanout-cone of the cut-set (R2 in FIG. 3). the number of paths (dynamic connectivity measure), it occurs in, is recursively estimated from cut-set to the objective. Note that the paths due to the gates in R3 are ignored. In this way, gates that connect the cut-set to the objective are assigned dynamic connectivity measures depending on their connectivity to the objective and cut-set.

While backtracing from the objective, we will encounter two types of gates, as illustrated in FIG. 3:
1. Gates in between the cut-set and the objective—R2: For these gates, we make use of the dynamic connectivity measures, since it is a representative of the connectivity of the gate to previous decisions and objective.
2. Gates that are not directly connected to cut-set—R3: For these gates, we use the static connectivity measures to select the gate that is well connected to the objective. Note that the dynamic connectivity measures for these gates are "0", because they are not directly connected to the cut-set.

It may be noted that if a gate, g, does not lie in between the cut-set and objective, i.e., g∈ R3, then all the gates in the fanin-cone of g cannot lie in between the cut-set and ohjective, as shown in FIG. 3. While backtracing, once we reach a gate with 0-dynamic connectivity measure we can start using the static connectivity measure for all the gates in its fanin cone. This helps us to implement an easy single switch from dynamic connectivity measures to static connectivity measures while backtracing in the circuit.

As discussed above, a cut-set is obtained by a multiple backtrace from the objective to the primary inputs of the circuit. Since we are choosing connected variables together, all elements in the cut-set tend to be closer to each other. As a result, we are more likely to obtain cut-sets with smaller widths.

A slight variation of our technique is to select the variables based on static connectivity measures alone. In that case, we need not update the dynamic connectivity measures for every backtrace. Due to its ease of explanation, we use the static connectivity measures in this example. FIG. 4 demonstrates our technique for a reconvergent structure that is present in many circuits. For the circuit shown in FIG. 4, the objective of the ATPG engine is to find all solutions that satisfy the objective h=1. The SCOAP measures, (C1, C0) and our static connectivity based measures, (m) are tabulated and listed in FIG. 4. The traditional guidance heuristic in PODEM traverses the path it h-f-a and picks a as the first decision. Note that there was a choice at gate f on the path in which either a or e could be selected. a is chosen by SCOAP since it is easier-to-control when compared to e. This decision process continues and the final complete decision tree obtained for all solutions is shown in FIG. 4. In this tree, a solid edge indicates the 1-branch and a dashed edge represents the 0-branch for each node.

For the same circuit in FIG. 4, our new heuristic backtraces through e (after h-f) first, since it occurs in many paths as compared to a. If we follow our guidance heuristics for the rest of the backtraces, the corresponding decision tree obtained is shown in FIG. 4. The first solution obtained by each technique is highlighted by a dotted enclosure in the corresponding decision tree. It is seen that SCOAP-guided ATPG finds the first solution in only two decisions—{a, $\bar{d}$}, and our technique finds the first solution in three decisions—{b, c, $\bar{d}$}. However, the number of nodes in the decision tree in FIG. 4 obtained by our technique (five) is less than the number of nodes in the decision tree obtained by using SCOAP measures (seven). It may be noted that the nodes, N4 and N5 in FIG. 4 are identical. These nodes will be shared in the Free BDD and the effective number of nodes required to store the solution-set is only four. Through this example, we see that although SCOAP finds the first solution in fewer decisions, our technique computes the complete solution-set in a fewer number of decisions.

Search-State Based Symmetry

In this section, we introduce a few definitions and theorems that help to analyze the search-states occurring in the decision tree of an ATPG engine.

Equivalence: Two search-states are said to be equivalent if they lead to the same sub-decision tree for a given ATPG.

Symmetry: Two partial input assignments are said to be symmetric if they form equivalent search-states.

For example, in FIG. 4 the search-states at nodes N4 and N5 are equivalent and the corresponding partial input assignments {b,$\bar{c}$} and {$\bar{b}$} are symmetric. Note that this notion of symmetry is different from the ones that are generally used. Unlike previous methods, where permutations of full specified input assignments and symmetry on two variables were used, we define symmetry on partial input assignments that form different decompositions of the circuit during ATPG.

Theorem 1 If two cut-sets are equal (same), then they rep-resent equivalent search-states.

Proof: Cut-sets that are equal decompose a circuit to identical sub-circuits. If the same decision process is used, then the decision tree for identical sub-circuits will definitely be isomorphic. Since the sub-decision trees are the same, the corresponding search-states represented by equal cut-sets are equivalent.

Theorem 2 All equivalent search-states are NOT necessarily represented by the same cut-set.

Figure 5B:
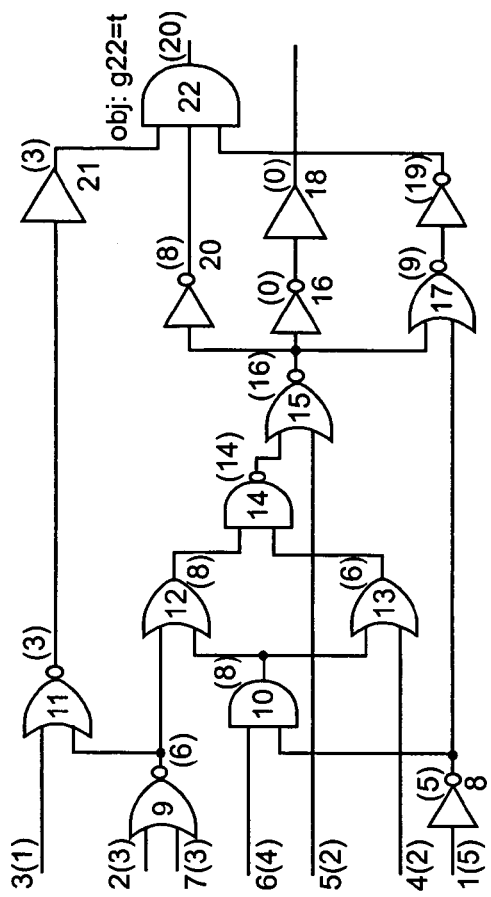
FIG. 5 is a partial decision tree and logic diagram used to illustrate a counter-example for Theorem 2.
Figure 5A:
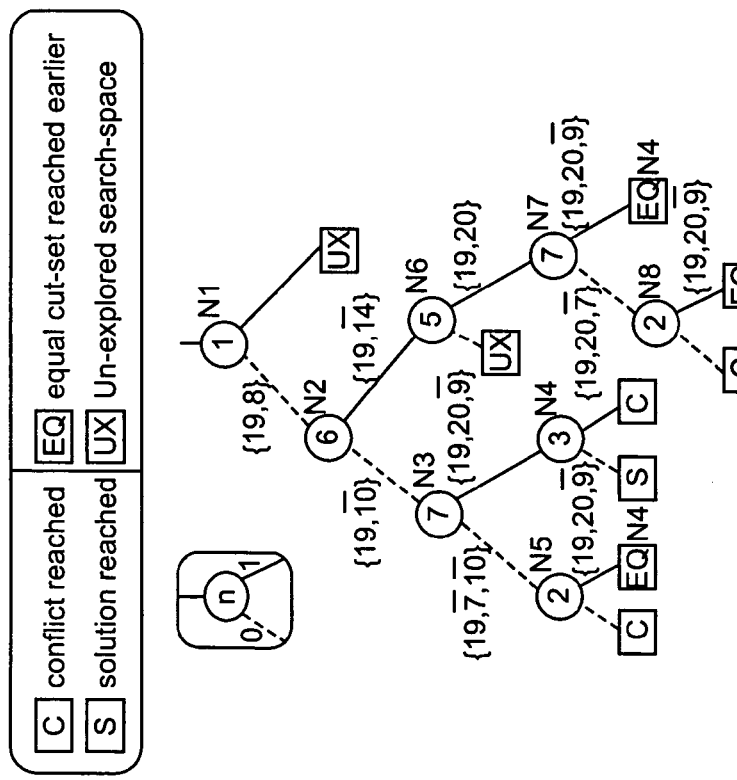

Proof: We prove Theorem 2 by showing a counter-example. where two different (unequal) cut-sets represent equivalent search-states. FIG. 5 (B) shows the ISCAS '89 circuit—s27, modified to find the one-cycle preimage for 001 at the next state flip-flops. The objective is to justify a 1 at the output of gate 22 in the circuit. The guidance measures are shown in brackets near each gate in the circuit. Note that the guidance measures are only heuristics, and they change the structure of the decision tree. Different guidance measures lead to different cut-sets. We show that for a fixed guidance heuristic, different cut-sets can sometimes lead to the same sub-decision tree.

A partial decision tree obtained during the ATPG is shown in FIG. 5. The solid edge is the 1-branch and the dashed edge is the 0-branch for each node. The nodes are labeled in chronological order of decisions. The terminal nodes refer to a solution or a conflict or an equivalent search-state (due to equal cut-sets) that was stored earlier. The link for the equivalent search-state terminals are shown by the node numbers next to the terminal nodes. For example, the 1-branch of N5 is connected to N4, since the corresponding cut-sets are equal. It may be observed in the decision tree that the 0-branch of N2 and 1-branch of N6 have isomorphic sub-trees below them. However, the corresponding cut-sets are unequal. By definition of equivalence, the two search-states represented by cut-sets—{19, $\overline{10}$} and {19, 20} are equivalent. However, the corresponding cut-sets are different.

Corollary Success driven learning is a restricted realization of equivalence in search-stares.

Proof: In success driven learning, we use the cut-sets as a representative for the search-states. A cut-set is stored only if it leads to at least one solution. If an exact match for the solution cut-set occurs again, then we use the cut-set. From Theorem 2, we saw that unequal cut-sets can also represent equivalent search-states. On the other hand, even if a search-state leads to a conflict sub-space then its equivalent search-state will also lead to a conflict sub-space. This phenomenon is not exploited in success driven learning.

From the above discussion, it is seen that certain cut-states exist that lead to the same search sub-space and not identified by the success driven learning. Since equivalent cut-states lead to the same search sub-space in general, it is immaterial if they are solution cut-sets or conflict cut-sets. As a result, success driven learning can be extended to prune conflict subspaces as well.

Cut-Set Occurring Probability

Cut-sets that occur frequently during ATPG help to prune search subspaces, while other cut-sets may be less useful to the "all-solutions ATPG engine". It is desirable to store only the cut-sets that occur frequently during the search process. Cut-sets that do not occur again or with low probability of occurrence can be ignored to save memory without loss of performance. Therefore, it prompted us to develop a metric that determines the usefulness of a cut-set. Based on this metric, we may decide to store a cut-set or ignore it. This will help to reduce the memory requirement for the knowledge base, without significant loss of information.

A cut-set, C, comprises of a set of specified gates, say $$C=\{g_1, g_2, g_3, \ldots, g_n\}$$

where, $g_i$ is a gate at the frontier of the search-state/cut-set and, n is the number of gates in the cut-set.

A cut-set can occur multiple times only if it has many symmetric input assignments. An appropriate way to analyze the use of a cut-set is to count the number of symmetries that generate the same cut-set. If there are many symmetric assignments, then the cut-set is likely to occur again. For example, in FIG. 6, the symmetric input assignments that generate the same cut-set {g, f, b} for the circuit are listed. It can be observed that it is very time-consuming to count the number of symmetric assignments that generate the same cut-set after each decision. Even if we count all the symmetric input assignments, a given ATPG engine may not consider all of them. As an alternative, we estimate the use of a cut-set using probabilistic measures.

The probability of occurrence of a 0 or 1 at the primary inputs is initialized to be 0.5. Then, we recursively estimate the probability of occurrence of a value at the output of each gate assuming all the inputs are independent. For example, the probability of occurrence of 1 at the output of an AND gate is 0.25.

We conducted a second set of experiments to verify the effectiveness of the cut-set metric for reducing the cut-set storage. As a reference FIGS. 7 and 8 respectively show an All Solutions ATPG for ISCAS '89 circuits (Table 1) and an All Solutions ATPG for ITC '99 circuits (Table 2). The ATPG environment was set up similar to the previous experiments to generate all solutions. In addition, the number of cut-sets we can store was limited to 300,000. After each decision, the cut-set was determined and its probability of occurrence was estimated. Cut-sets with probabilities less than a fixed CUTSET THRESHOLD were ignored. The probability of occurrence of the objective was fixed as the CUTSET-THRESHOLD. The corresponding results are tabulated in Table 3 of FIG. 9. For each circuit shown in column 1, columns 2-6 report the number of solutions, number of BDD nodes, number of stored cut-sets, number of times the stored cut-sets are used and the time taken without using the cut-set metric. The number of times the stored-cutsets, as a whole, are used is counted every time a hash-hit for a cut-set is successful. Columns 7-11 report the results for the same ATPG by storing only the cut-sets with a high probability of occurrence.

For the objectives in smaller circuits like s349, s444 and s526, the cut-sets that are stored is reduced. However, since they are very small in number, all the cut-sets can be easily stored. On the other hand, in cases where large number of cut-sets are encountered, as in s1423.1, s4863, b04 and b11, the number of cut-sets is significantly reduced without significant loss in time. The main advantage in using the cut-set metric is exhibited in the cases of s1423 and s9234. Without using the proposed cut-set metric, all the cut-sets are exhausted and the ATPG engine fails to complete. The number of times the stored-cutsets are used varies according to the target objective in the two methods. Sometimes, longer cut-sets in the lower part of the decision tree are NOT stored in the second method. However, the ATPG quickly makes the fewer decisions to reach the terminal nodes. This results in fewer hash-hits in the second method without significant loss in time as seen in b11. On the other hand, some cut-sets that are used fewer times in the first method are not available to the second method. So the available cut-sets are used many times in the second method, leading to an in-crease in the number of times the stored-cutsets are used, as seen in s1269 and s15850.1.

Although the metric is helpful to obtain a probabilistic estimate for the use of a cut-set, a low value does not completely guarantee that the cut-set will not be re-used again. This uncertainty may lead to losing useful cut-sets occasion-ally. In such cases, the ATPG engine may have to re-search a previously visited search space and take more time as seen in s15850.1. This phenomenon may increase as the size of the circuit increases due to correlation of gates in the circuit.

We explored above the factors that govern an all-solutions ATPG engine. While conventional guidance heuristics for ATPG are suitable for finding a single solution quickly, they do not account for the complete-solution set. We presented a new connectivity based guidance heuristic for an "all-solutions ATPG engine" that reduces the size of the Free BDD to store all solutions. We also developed a probabilistic cut-set metric to determine the future use of stored information, learnt during success driven learning. Based on the cut-set metric, we showed that the knowledge base can be reduced depending on the CUTSET-THRESHOLD determined for the cut-set. Experimental results show that we can achieve significant reductions in memory and our techniques can guide the ATPG engine to find all the solutions where conventional guidance heuristics fail. In the future, we plan to apply partitioning of variables to obtain a better variable order. We also plan to consider the effect of signal correlations to improve the guidance for ATPG and develop a dynamic cut-set threshold value to get a better approximation for the cut-set usability. With these feasible techniques, we envision a robust ATPG engine that can be effectively used for model checking sequential circuits as well as for improving the defect coverage of a test-suite.

While the invention has been described in terms of a single preferred embodiment, those skilled in the art will recognize that the invention can be practiced with modification within the spirit and scope of the appended claims.

The invention claimed is:

1. A method for identifying all states of an electronic circuit from which a given target state of the electronic circuit may be reached, the circuit having a plurality of gates and having a plurality of primary inputs, the target state representing an objective, wherein the objective is a given state of at least one of the gates, comprising backtracing from the objective to the primary inputs, comprising a) setting a connectivity value, for each of the gates, to an initial value;

b) generating and storing a branch-and-bound decision for reaching the objective from a cut-set;

c) generating a new branch-and-bound decision, the generating based on a heuristic selecting gates having higher connectivity with the previously generated and stored branch-and-bound decisions;

d) computing a new search subspace corresponding to the new branch-and-bound decision, e) performing a success-driven learning, comprising
determining whether or not the new search subspace is equivalent to a previously computed search subspace, the determining including comparing the new cut-set with previously stored cut-sets, and
if the determining identifies the new cut-set as being the equivalent of a previously stored cut-set, linking the new search subspace with the previously computed search subspace corresponding to the same previously stored cut-set, f) computing an estimate of a probability of the new cut-set occurring in a subsequent iteration, wherein the estimating includes calculating the product of signal probabilities of specified gates in the cut-set;

g) if the computed estimate for the probability meets a given probability threshold, storing the new cut-set, else not storing the new cut-set;

h) dynamically updating the connectivity for each gate, by computing the number of paths that connect the gate to the cut-set, if any, formed by the previously generated and stored branch-and-bound decisions, i) repeating steps (b) through (h) until the search is completed; and constructing the decision graph based on the stored cut-sets, the constructed decision graph representing all the solutions computed for the target objective.

2. The method of claim 1, wherein the step (f) calculating the product of the signal probabilities of the specified gates in the cut-set performs the calculation by assuming a given input signal of value "0" or "1" having equal probability on all primary inputs, and by assuming the signal values on the primary inputs being statistically independent, and by recursively calculating the probabilities of output values of the specified gates in the subset based on said assumptions.

3. The method of claim 2, wherein the step (g) storing stores new cut-sets in a hash table representing a decision tree having nodes and branches, and wherein step (e) comparing searches the hash-table and if the searching identifies an equivalent cut-set in said hash-table, links a current branch of the decision tree to a shared node of the decision tree.

4. The method of claim 1, wherein the step (g) storing stores new cut-sets in a hash table representing a decision tree having nodes and branches, and wherein step (e) comparing searches the hash-table and if the searching identifies an equivalent cut-set in said hash-table, links a current branch of the decision tree to a shared node of the decision tree.

* * * * *